United States Patent
Kim et al.

(10) Patent No.: US 11,263,988 B2
(45) Date of Patent: Mar. 1, 2022

(54) GATE DRIVING CIRCUIT AND DISPLAY DEVICE USING THE SAME

(71) Applicant: LG Display Co., Ltd., Seoul (KR)

(72) Inventors: Yeonkyung Kim, Daejeon (KR);
Taewoong Moon, Paju-si (KR);
Junghyun Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 211 days.

(21) Appl. No.: 15/723,958

(22) Filed: Oct. 3, 2017

(65) Prior Publication Data

US 2019/0103067 A1    Apr. 4, 2019

(51) Int. Cl.
| | | |
|---|---|---|
| *G11C 19/00* | (2006.01) | |
| *G09G 3/36* | (2006.01) | |
| *G09G 3/3266* | (2016.01) | |
| *G06F 3/041* | (2006.01) | |
| *G11C 19/28* | (2006.01) | |

(52) U.S. Cl.
CPC ......... *G09G 3/3677* (2013.01); *G06F 3/0412* (2013.01); *G09G 3/3266* (2013.01); *G09G 3/3688* (2013.01); *G09G 3/3696* (2013.01); *G11C 19/28* (2013.01); *G09G 2300/0408* (2013.01); *G09G 2310/0286* (2013.01); *G09G 2310/0291* (2013.01)

(58) Field of Classification Search
None
See application file for complete search history.

(56) References Cited

U.S. PATENT DOCUMENTS

| | | | | |
|---|---|---|---|---|
| 2005/0212746 | A1* | 9/2005 | Iwasaki | G09G 3/3677 345/100 |
| 2006/0001637 | A1* | 1/2006 | Pak | G11C 19/184 345/100 |
| 2007/0086558 | A1* | 4/2007 | Wei | G11C 19/28 377/64 |
| 2008/0219401 | A1* | 9/2008 | Tobita | G09G 3/3677 377/79 |
| 2008/0224985 | A1* | 9/2008 | Jang | G11C 19/28 345/100 |
| 2012/0249502 | A1* | 10/2012 | Takahashi | G09G 3/3677 345/205 |
| 2014/0119493 | A1* | 5/2014 | Yang | G11C 19/28 377/64 |
| 2016/0028370 | A1* | 1/2016 | Nakagawa | H03H 3/02 310/370 |
| 2016/0128847 | A1* | 5/2016 | Kurtaliaj | A61F 2/4611 623/17.16 |
| 2017/0193888 | A1* | 7/2017 | Moon | G09G 3/20 |
| 2017/0309240 | A1* | 10/2017 | Zhang | G09G 3/36 |
| 2018/0080973 | A1* | 3/2018 | Zhang | G09G 3/006 |
| 2018/0308444 | A1* | 10/2018 | Sueki | G09G 3/20 |

* cited by examiner

*Primary Examiner* — Tuan T Lam
(74) *Attorney, Agent, or Firm* — Polsinelli PC

(57) ABSTRACT

The present disclosure relates to a gate driving circuit and a display device using the circuit. A gate driving circuit according to an aspect of the present disclosure comprises a Q node controller, a QB node controller, and an output unit generating a pulse-type output signal by controlling charging and discharging of an output terminal according to the voltages of the Q node and the QB node, and the QB node controller controls the voltage of the QB node in an alternating manner during a non-scan period in which the Q node controller outputs a low level voltage for the Q node.

12 Claims, 15 Drawing Sheets

GATE DRIVING CIRCUIT AND DISPLAY DEVICE USING THE SAME

BACKGROUND

Field of the Disclosure

The present disclosure relates to a display device, and more particularly, to a gate driving circuit and a display device using the same. Although the present disclosure has a wide scope of applications, it is particularly suitable for reducing ripples in a gate signal without enlarging a bezel area.

Description of the Background

Types of flat panel display devices include liquid crystal display (LCD), plasma display panel (PDP), organic light emitting diode (OLED), and electrophoretic display (EPS).

A driving circuit of a display device includes a pixel array displaying an image, a data driving circuit providing data signals to data lines of the pixel array, a gate driving circuit (or scan driving circuit) providing a gate pulse (or scan pulse) synchronized with the data signal sequentially to gate lines (or scan lines) of the pixel array, and a timing controller controlling the data driving circuit and the gate driving circuit.

Each pixel includes a thin film transistor (TFT) providing a data line voltage to pixel electrodes in response to a gate pulse. The gate pulse swings between a gate high voltage (VGH) and a gate low voltage (VGL). The VGH is set to be higher than a threshold voltage of a pixel TFT, and the VGL is set to be lower than the threshold voltage of the pixel TFT.

A recent technology enables a gate driving circuit embedded into a display panel (an area obscured by the bezel of a display device) along with a pixel array, where the gate driving circuit embedded in the display panel is called a gate in panel (GIP) circuit. The GIP circuit includes a shift register. The shift register includes a plurality of stages connected in a cascade manner.

Each stage of the shift register generates a gate signal in response to a carry signal and a clock signal received from the previous stage and/or subsequent stage, which includes a switch circuit for charging or discharging the gate lines. The switch circuit includes TFTs such as a metal oxide semiconductor field effect transistor (MOSFET).

Physical characteristics of a TFT vary according to DC gate bias stress (often referred to as DC stress) or temperature of an operating environment. The DC stress increases in proportion to the magnitude of a DC voltage applied to the gate of a TFT and the period for which the DC voltage is applied. Because of the DC stress, the threshold voltage of the TFT is shifted, thereby reducing an on-current of the TFT.

Suppose a simple GIP circuit including only a pull-up TFT is employed to keep the stable high level of a gate signal. If the simple GIP circuit drives a landscape panel the length along the horizontal direction of which is larger than the length along the vertical direction, gate lines are coupled to data lines, causing ripples in gate signals.

Meanwhile, the above problem may be somewhat solved by employing a GIP circuit that includes a pull-down TFT for maintaining the stable low level of the gate signal with the pull-up TFT. However, this approach increases the number of TFTs constituting a switch circuit for charging and discharging the voltages of a Q node and a QB node that are used to control the pull-up TFTs and the pull-down TFTs, respectively. Moreover, the size of a TFT (TFT width) has to be enlarged to cope with the situation where the gate voltage is reduced when the threshold voltage is increased due to the degradation of the TFT. These all together make it difficult to reduce the bezels surrounding a display panel.

Also, the period in which a gate signal maintains the low level voltage is longer than the period in which the gate signal is at the high level. While the gate signal is kept to the low level voltage, TFTs for maintaining the QB node at the high level voltage receive DC stress continuously, which subsequently degrades the corresponding TFTs.

SUMMARY

The present disclosure is directed to solve the problem above, and is to provide a gate driving circuit capable of reducing ripples in a gate output signal.

In addition, the present disclosure is to provide a gate driving circuit using a smaller number of TFTs and using TFTs with a smaller size when TFTs are added for the purpose of minimizing ripples.

Further, the present disclosure is to provide a gate driving circuit preventing TFTs from being influenced by DC stress.

A gate driving circuit according to an aspect of the present disclosure comprises a Q node controller controlling a voltage of the Q node; a QB node controller controlling a voltage of a QB node; and an output unit generating a pulse-type output signal synchronized with a part of a first clock by controlling charging and discharging of an output terminal according to the voltages of the Q node and the QB node.

The QB node controller controls the voltage of the QB node in an alternating manner during a non-scan period in which the Q node controller outputs a low level voltage for the Q node. Also, the QB node controller may keep the QB node voltage at a low level voltage while the output unit outputs a high level output signal.

The Q node controller pre-charges the Q node at a high level voltage and change the high level voltage of the Q node to a low level voltage after a pulse is generated.

The output unit outputs a gate pulse by charging the output terminal from bootstrapping the Q node and maintain the output terminal at the low level voltage according to the QB node voltage that swings between high level and low level voltages. Also, the output unit may maintain the output terminal at the low level voltage according to a second clock lagging the first clock by four horizontal periods (4H). Also, the output unit may suppress the ripples generated at the output terminal by using the low level voltage of the first clock.

A display device according to another aspect of the present disclosure comprises a display panel including data lines, gate lines, and pixels defined by the data lines and the gate lines; a data driving circuit providing data signals to the data lines of the display panel; a gate driving circuit providing gate pulses synchronized with the data signal to the gate lines of the display panel and including a plurality of stages connected in a cascade manner; and a timing controller controlling timing of the data driving circuit and the gate driving circuit, wherein each stage includes a Q node controller, a QB node controller, and an output unit generating a gate pulse synchronized with a part of a first clock by controlling charging and discharging of an output terminal according to the voltages of the Q node and the QB node; and the QB node controller controls a voltage of the QB node in an alternating manner during a non-scan period in which the Q node controller outputs a low level voltage for the Q node.

Therefore, ripples in a gate signal may be reduced while a smaller number of TFTs are employed to construct a switch circuit. Also, bezels can be made slim by forming a switch circuit with small-sized TFTs. Also, by implementing the TFTs for discharging output terminals to operate in an alternating manner, the TFTs may be prevented from being subjected to DC stress, and degradation of the TFTs may be delayed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

A display device of the present disclosure may be implemented by using a flat panel display device such as a liquid crystal display (LCD), field emission display (FED), plasma display panel (PDP), organic light emitting display (OLED), or electrophoretic display (EPD).

In what follows, various aspects of the present disclosure will be described in detail with reference to appended drawings. Throughout the specification, the same numbers actually refer to the same elements. In describing the present disclosure, a detailed description of known functions or configurations incorporated herein unnecessarily obscure the gist of the present disclosure, the detailed description thereof will be omitted.

Figure 1:
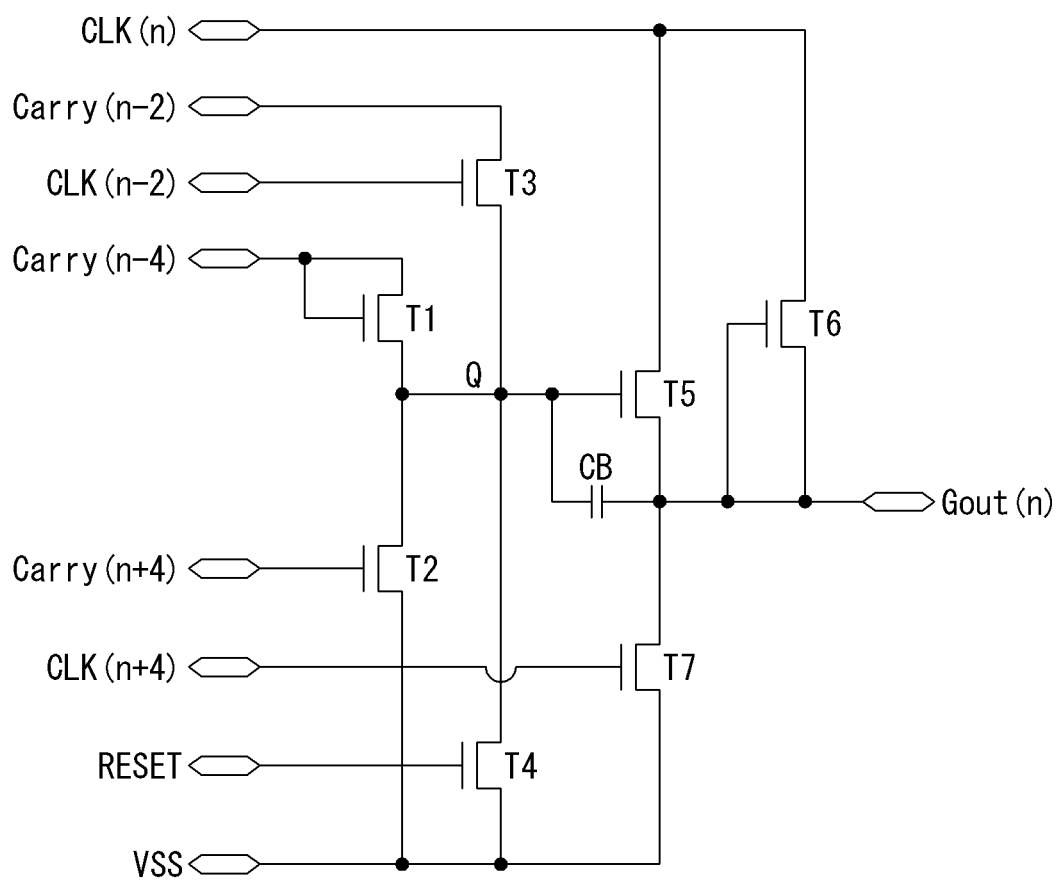
FIG. 1 illustrates a GIP circuit employing pull-up TFTs only according to the related art.
Figure 2:
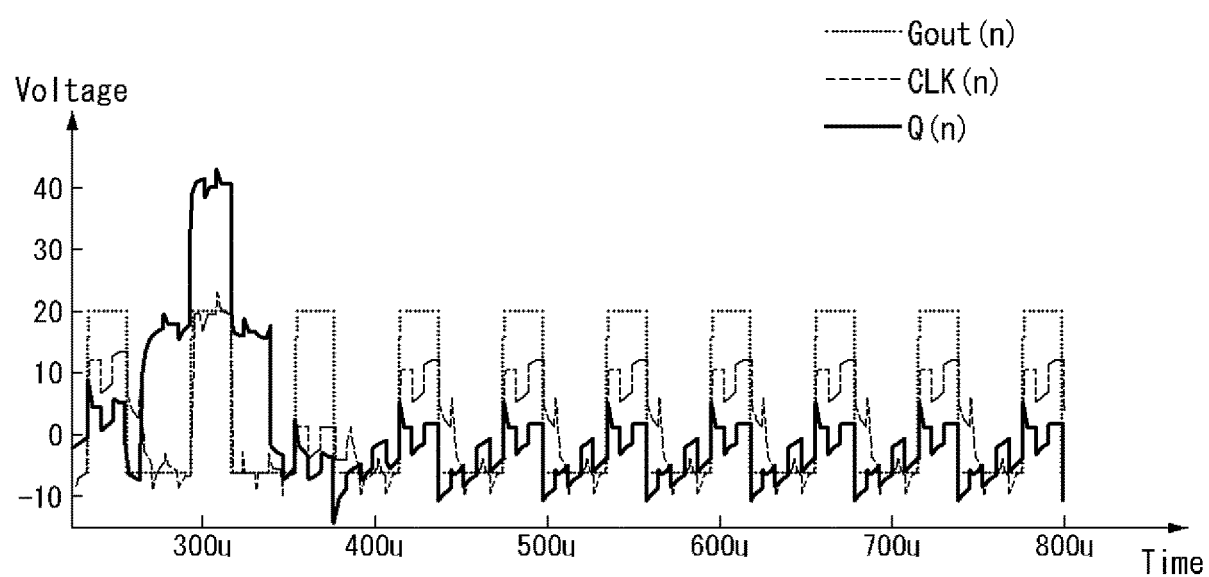
FIG. 2 illustrates an example in which ripples are generated in an output signal due to the GIP circuit of FIG. 1.

FIG. 1 illustrates a GIP circuit employing pull-up TFTs only according to the related art, and FIG. 2 illustrates an example in which ripples are generated in an output signal due to the GIP circuit of FIG. 1.

The GIP circuit of FIG. 1 includes seven TFTs and one bootstrapping capacitor CB. The Q node transitions to the high level (high potential voltage) by a first TFT (T1), the voltage of the Q node rises close to 40 V from a bootstrapping effect in accordance with a first clock signal (CLK(N)), T5 is turned on to charge the output terminal Gout(n) in a stable manner, and gate pulses are output.

However, when the GIP circuit of FIG. 1 drives a landscape panel according to an interlace scheme, severe ripples are generated in the gate signals from a specific pattern, resulting in degradation of image quality. A simulation study shows that the interlaced driving causes a load on the gate line to be increased and thus makes the gate line coupled to the data line, and as shown in FIG. 2, ripples are generated at the output terminal and Q node. The preceding operation is confirmed from the simulation since ripples at the Q node are transmitted to the output terminal when the fifth TFT (T5) is at a voltage level of −1 V. In this structure, when a second clock (CLK(n+4)), which lags the first clock (CLK (n)) by four horizontal periods (4H), is at a high level (high potential voltage) (when the first clock (CLK(n)) is at the low level), the output terminal is readily pulled down by a fourth TFT (T4), but T6 can be be turned on by the ripples generated at the Q node or output terminal when the first clock (CLK(n)) is at the high level, which makes the structure vulnerable to ripples.

As described above, the GIP circuit based on a simple architecture as shown in FIG. 1 is vulnerable to ripples for some time intervals. To make up for the aforementioned weakness, the GIP circuit may be formed so that one QB node controls a pull-down TFT which discharges the output terminal, or two QB nodes discharge the output terminal.

Figure 3:
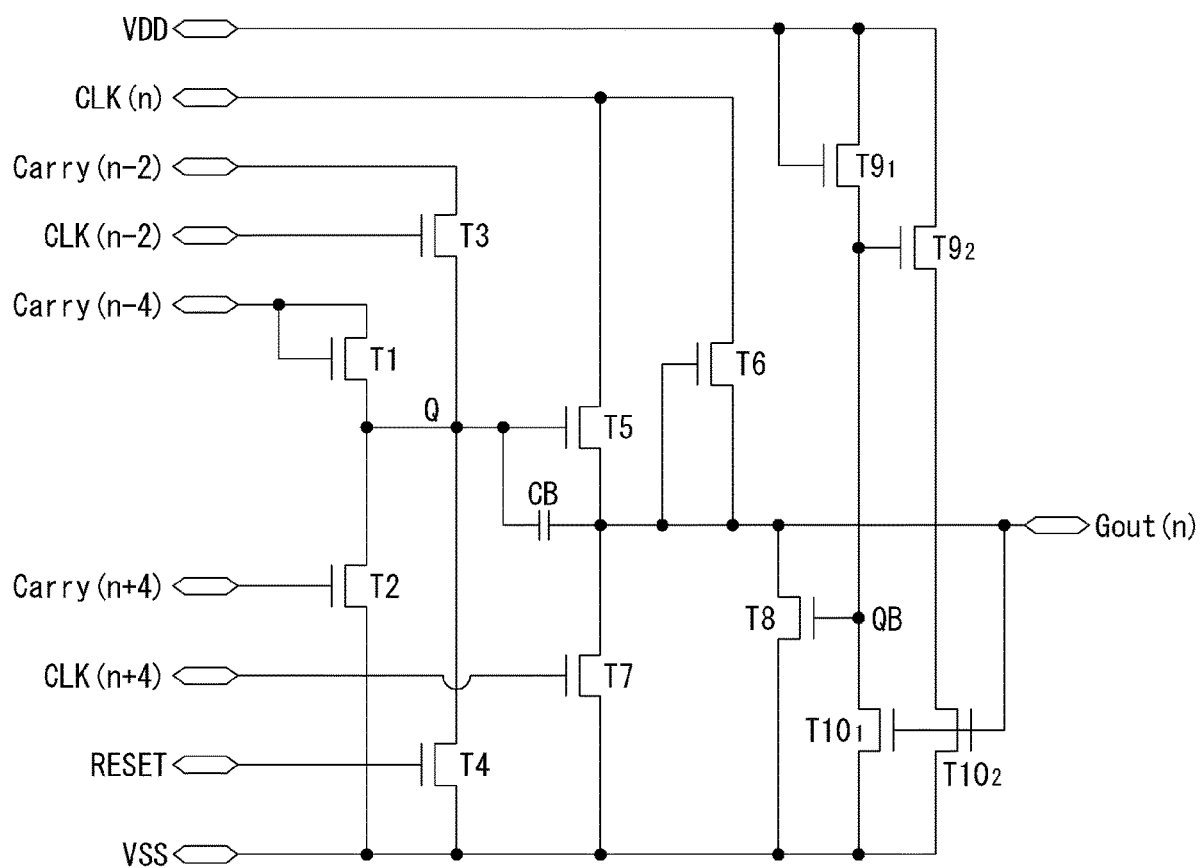
FIG. 3 illustrates a GIP circuit employing additional pull-down TFTs to solve the ripple problem caused by the GIP circuit of FIG. 1.

FIG. 3 illustrates a GIP circuit employing additional pull-down TFTs to solve the ripple problem caused by the GIP circuit of FIG. 1.

The GIP circuit of FIG. 3 is added with five or more TFTs to the GIP circuit of FIG. 1. In a two stage block comprising a 91th TFT (T91) and a 92th TFT (T92), the gate voltage of the 92th TFT (T92) is reduced to VGH-Vth91 when the threshold voltage of the 91th TFT (T91) is degraded. To compensate this reduction of voltage, the circuit has to be designed by extending the width of the 92th TFT (T92) such that the width of the 92th TFT (T92) becomes 90 μm when the width of the 91th TFT (T91) is 10 μm. Also, to maintain the QB node at the low level (gate low voltage (VGL) or low potential voltage) when the output terminal (Gout(n)) is at the high level (gate high voltage (VGH) or high potential voltage), the width of a 102th TFT (T102) has to be 1.5 to 2 times the width of the 92th TFT (T92); therefore, the width of the 102th TFT (T102) has to be larger than 150 μm.

If the widths of TFTs comprising the QB node are to be reduced to slim down the bezel of a display device, the QB node has to be constructed by using a single stage block comprising a 9th TFT (T9) instead of constructing the QB node in the form of a two-stage block comprising the 91th TFT (T91) and the 92th TFT (T92). However, when a single stage block is employed, the QB node has to be maintained at a high level (high potential voltage) continuously during a non-scan period (e.g., the period for which the Q node is maintained at a low potential voltage) excepting the (scan)

period for which the Q node is charged (maintained at a high potential voltage). Consequently, DC stress is applied continuously to an 8th TFT (T8), thereby making the 8th TFT (T8) easily degraded.

To solve the aforementioned problem, the present disclosure adds four TFTs to the GIP circuit of FIG. 1 to form the QB node, but minimizes the width of each TFT and drives the QB node in an alternating manner.

Figure 4:
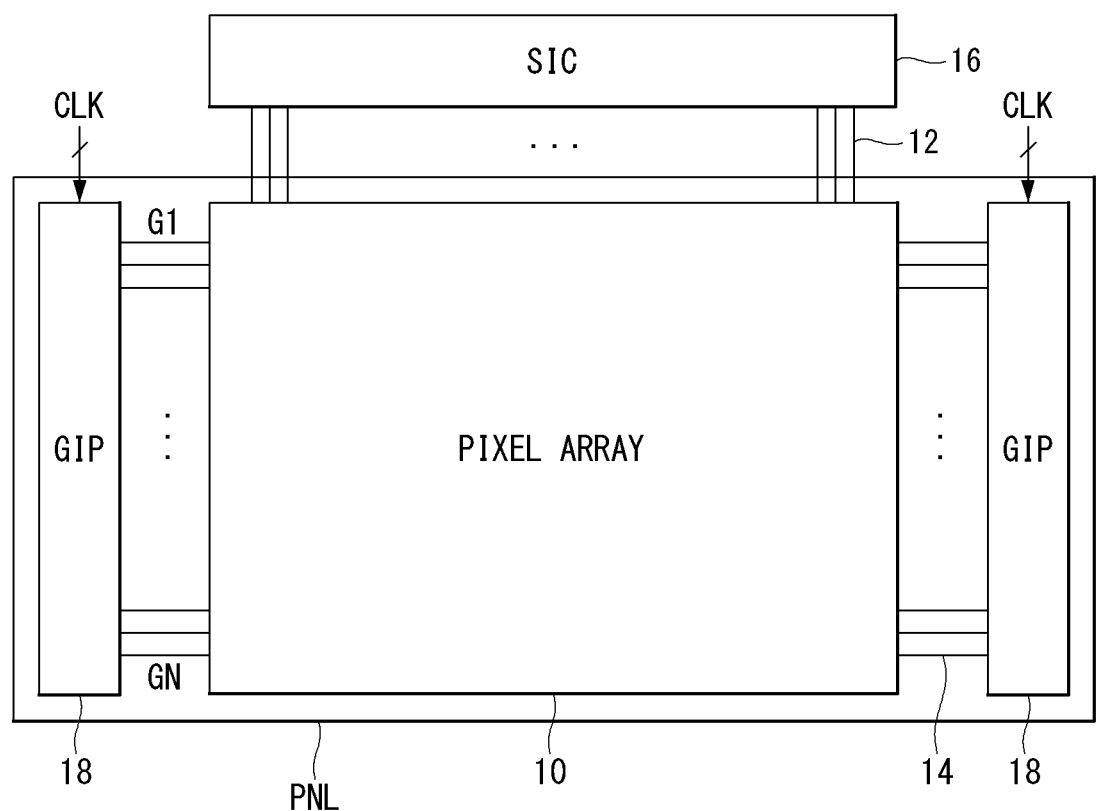
FIG. 4 is a block diagram illustrating a driving circuit of a display device according to an aspect of the present disclosure.
Figure 5:
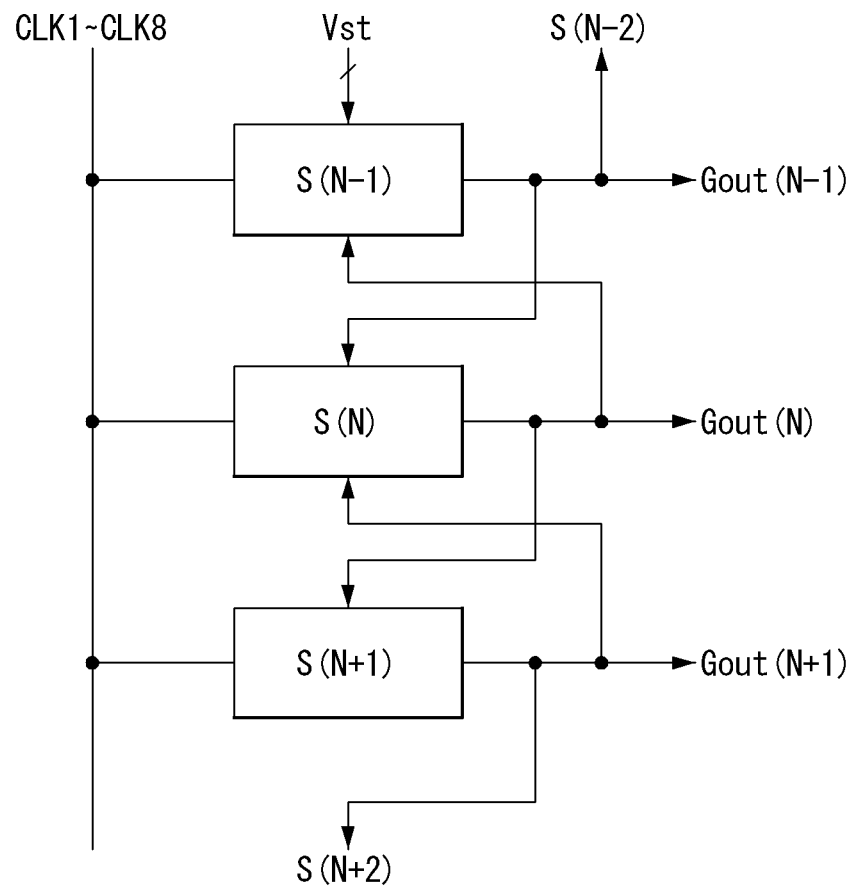
FIG. 5 illustrates a shift register of a GIP circuit.

FIG. 4 is a block diagram illustrating a driving circuit of a display device according to an aspect of the present disclosure, and FIG. 5 illustrates a shift register of a GIP circuit.

A display device according to an aspect of the present disclosure includes a display panel (PNL) and a driving circuit for writing data of an input image to a pixel array of the display panel (PNL).

The display panel (PNL) may be implemented in the form of a panel of a flat panel display device requiring a GIP circuit, such as the LCD or OLED display device.

The display panel (PNL) comprises data lines 12, gate lines 14 orthogonal to the data lines 12, and a pixel array in which pixels are disposed in the form of a matrix defined by the data lines 12 and the gate lines 14. An input image is reproduced in the pixel array.

A driving circuit includes a data driving circuit (SIC, 16) providing data signals to the data lines 12, a GIP circuit 18 providing gate pulses synchronized with the data signals sequentially to the gate lines 14, and a timing controller (TCON, 20).

The timing controller 20 transmits digital data of an input image received from an external host system to the data driving circuit 16; receives timing signals synchronized with an input image from the host system, such as a vertical synchronization signal, a horizontal synchronization signal, a data enable signal, and a dot clock; and controls operation timing of the data driving circuit 16 and the GIP circuit 18 by using the received timing signals. The GIP circuit 18 may be implemented at one of boundaries or at both boundaries of the display panel (PNL) outside the pixel array. The GIP circuit may be formed on the substrate of the display panel (PNL) together with the pixel array.

The GIP circuit 18 includes a shift register. The shift register comprises stages (S(N−2)–S(N+2)) connected in a cascade manner as shown in FIG. 5. Each stage (S(N−2)–S(N+2)) receives a start pulse (Vst) that swings between a high level voltage (VGH) and a low level voltage (VGL), a shift clock (CLK1-CLK8) (referred to as a clock hereinafter), and a reset signal.

The stages (S(N−2)–S(N+2)) start to output gate pulses in response to the start pulse (Vst) and shift the output according to the clock (CLK1 to CLK8). The output signals output sequentially from the stages (S(N−2)–S(N+2)) are supplied to the gate lines 14 as gate pulses. One or more gate pulses from previous stages (S(N−1)–S(N−4)) are supplied as a start pulse of the next stage, and the output of a stage may be supplied to one of previous stages as a reset signal. Each stage may output a gate pulse and a separate carry signal and supply the output to a previous stage or subsequent stage as a control signal; for example, the output signal may be supplied to the next stage as a start pulse or to the previous stage as a reset signal.

Figure 6:
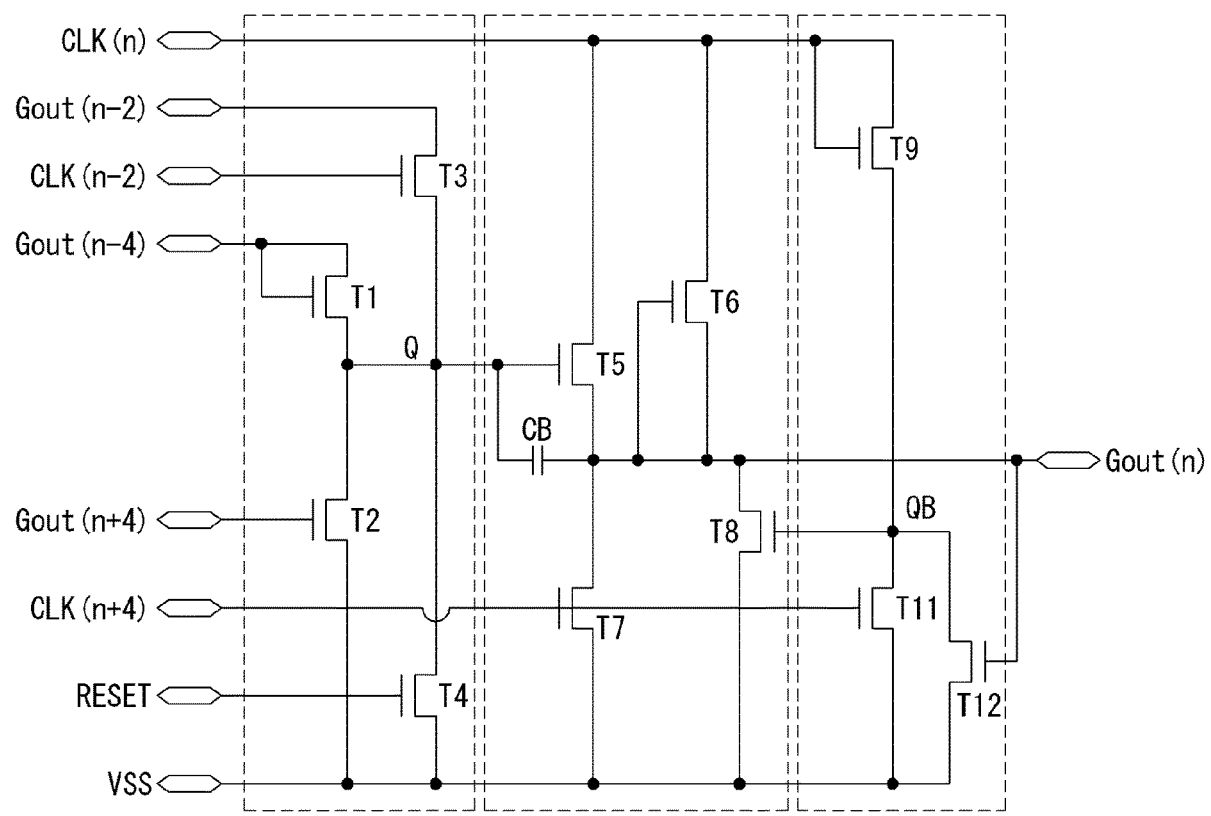
FIG. 6 illustrates a GIP circuit according to an aspect of the present disclosure.

FIG. 6 illustrates a GIP circuit according to an aspect of the present disclosure, depicting the stage shown in FIG. 5 in more detail. The circuit shown in FIG. 6 corresponds to an n-th (where n is a natural number) stage.

To remedy the problem of the GIP circuit shown in FIG. 1, the GIP circuit of FIG. 6 may add four TFTs (T8, T9, T11, and T12) for constructing a QB node. If the 9th TFT (T9) is built as a single stage block, the widths of the 8th (T8), the 9th (T9), and the 12th (T12) TFTs for generating a voltage for the QB node may be made to have 60 μm, 10 μm, and 45 μm, respectively, and the QB node may be driven an alternating manner by adding the 11th TFT (T11). By reducing the time period during which the 8th TFT (T8) discharging an output terminal is turned on, reliability of the circuit can be improved.

The GIP circuit of FIG. 6 comprises the 1st to $9^{th}$ TFTs, 11th TFT, 12th TFT (T1 to T9, T11, T12), and a bootstrapping capacitor (CB), where each element may be divided largely into a Q node controller (or first switching unit), a QB node controller (or second switching unit), and an output unit. Each TFT may be implemented by an n-type MOSFET.

8 phase-shifted clocks are used, where each clock has a pulse width of 3 horizontal periods (3H), and the phase of which is shifted by 1 horizontal period (1H). Neighboring clocks overlap each other by 1 horizontal period (1H).

The Q node controller may include the $1^{st}$ to $4^{th}$ TFT (T1 to T4), the QB node controller may comprise the 9th TFT (T9), 11th TFT (T11), and 12th TFT (T12); and the output unit may comprise the 5th to 8th TFTs (T5 to T8).

First, the Q node controller will be described.

The Q node controller generates a Q node voltage required for turning on the 5th TFT (T5), which is a pull-up TFT, to produce a gate pulse for the n-th stage. The Q node controller makes the Q node maintain at a high level voltage during a pulse period during which the gate pulse of the n-th stage is at a high level voltage and one or more horizontal periods (scan period) before and after the pulse period. In addition, the Q node controller makes the Q node maintain at a low level voltage for a remaining period (i.e., non-scan period) without being floated.

According to an output signal (Gout(n−4)) of the (n−4)-th stage or carry signal, the $1^{st}$ TFT (T1) is turned on to make the Q node be pre-charged to a high level voltage (VGH). Also, according to an output signal (Gout(n+4)) of the (n+4)-th stage or carry signal, the $2^{nd}$ TFT (T2) is turned on to make the Q node be discharged to a low level voltage (VGL). In other words, the first (T1) and the second TFT (T2) determine the period (scan period) during which the Q node is charged.

To implement the aforementioned operation, the drain and gate of the $1^{st}$ TFT (T1) are connected to the output signal (Gout(n−4)) of the (n−4)-th stage, and the source is connected to the Q node. In the case of the $2^{nd}$ TFT (T2), the drain is connected to the Q node, the gate is connected to the output signal (Gout(n+4)) of the (n+4) stage, and the source is connected to a low level power line (VSS) that outputs a low level voltage (gate low voltage, VGL).

Also, according to the control of a third clock (CLK(n−2)) leading the first clock (CLK(n)) by 2 horizontal periods (2H), the Q node may be prevented from being floated during the period (non-scan period) (the period for which the Q node is maintained at a low level voltage) excluding the period (scan period) for which the Q node is charged. Also, the Q node transitions to a discharged state as the 4th TFT (T4) is turned on according to a reset signal (RESET). In other words, the $3^{rd}$ clock (CLK(n−2)) periodically discharges or pulls down the Q node during the non-scan period.

To implement the aforementioned operation, the drain of the $3^{rd}$ TFT (T3) is connected to the output signal (Gout(n−2)) of the (n−2) stage, the gate is connected to the $3^{rd}$ clock (CLK(n−2)), and the source is connected to the Q node. On the other hand, the drain of the 4th TFT (T4) is connected to the Q node, the gate is connected to the RESET, and the source is connected to the low level power line (VSS).

Now, described will be the output unit comprising the $5^{th}$ to $8^{th}$ TFT (T5 to T8).

The output unit outputs the output signal (Gout(n)) of the n-th stage through the output terminal according to the Q node voltage and the $1^{st}$ clock (CLK(n)). The output unit generates a pulse of high level voltage as an output signal by being synchronized with a part period of the $1^{st}$ clock (CLK(n)) (the period belonging to a scan period in which the Q node is maintained at a high level voltage and a period in which the $1^{st}$ clock outputs a high level voltage) and generates a low level voltage for the remaining period.

The output unit may perform an operation of discharging the output terminal periodically so that ripples are not generated in an output signal while the output terminal outputs a signal (Gout(n)) of low level voltage.

The Q node is pre-charged according to the output signal (Gout(n−4)) of the (n−4)-th stage and rises to 2VGH when the $1^{st}$ clock (CLK(n)) at the high level voltage (VGH) is input; the $5^{th}$ TFT (T5) is turned on in response to the high level Q node voltage, supplies the $1^{st}$ clock (CLK(n)) to the gate lines, and raises the voltage of the gate lines.

The $6^{th}$ to $8^{th}$ TFT (T6 to T8) control the discharging of the output terminal during the non-scan period. The $6^{th}$ TFT (T6) discharges the output terminal to the low level voltage of the $1^{st}$ clock (CLK(n)) according to the voltage of the output terminal, the $7^{th}$ TFT (T7) is turned on by the $2^{nd}$ clock (CLK(n+4)) lagging the $1^{st}$ clock (CLK(n)) by 4 horizontal periods (4H) and discharges the output terminal, and the $8^{th}$ TFT (T8) discharges the output terminal according to the voltage of the QB node.

In other words, the $5^{th}$ TFT (T5) charges the output terminal to the high level voltage during the scan period, the $6^{th}$ TFT (T6) discharges the output terminal to the low level voltage when the output voltage is increased by ripples during the non-scan period, and the $7^{th}$ (T7) and the $8^{th}$ TFT (T8) discharges the output terminal to the low level voltage in an alternating manner during the non-scan period.

To implement the aforementioned operation, the drain of the $5^{th}$ TFT (T5) is connected to the $1^{st}$ clock (CLK(n)), the gate is connected to the Q node, the source is connected to the output terminal, and the bootstrapping capacitor (CB) is connected between the gate and the source.

The drain of the $6^{th}$ TFT (T6) is connected to the $1^{st}$ clock (CLK(n)), and the gate and the source are connected to the output terminal. In the case of the $7^{th}$ TFT (T7), the drain is connected to the output terminal, the gate is connected to the $2^{nd}$ clock (CLK(n+4)), and the source is connected to the low level power line (VSS). In the case of the $8^{th}$ TFT (T8), the drain is connected to the output terminal, the gate is connected to the QB node, and the source is connected to the low level power line (VSS).

Next, described will be the QB node controller comprising the $9^{th}$ (T9), the $11^{th}$ (T11) and the $12^{th}$ TFT (T12).

The QB node controls the $8^{th}$ TFT (T8) which discharges the output terminal in order to prevent the output terminal from being floated and prevent ripples from being generated during the not-scan period. The QB node controller controls the QB node to swing in an alternating manner. This operation is applied to prevent the gate of the $8^{th}$ TFT (T8) from receiving DC stress and thus to avoid degradation of the $8^{th}$ TFT (T8).

The $9^{th}$ (T9) and the $11^{th}$ TFT (T11) are activated in an alternating manner during the non-scan period to make the QB node voltage swing between the high level and the low level voltages, thereby making the $8^{th}$ TFT (T8) repeat turn-on and turn-off, namely making the output terminal discharged periodically during the non-scan period.

In order for the $9^{th}$ (T9) and the $11^{th}$ TFT (T11) to operate in an alternating manner during the non-scan period, the turn-on periods of the TFTs should not overlap with each other, which requires the clocks applied to the respective gates not to overlap with each other in the high level state. The $1^{st}$ clock (CLK(n)) and the $2^{nd}$ clock (CLK(n+4)) do not overlap with each other in their high level states since the pulse widths of the $1^{st}$ clock (CLK(n)) and the $2^{nd}$ clock (CLK(n+4)) extend 3 horizontal periods (3H), and the clocks lead or lag by 4 horizontal periods (4H). Thus the $1^{st}$ clock (CLK(n)) and the $2^{nd}$ clock (CLK(n+4)) may be applied to the $9^{th}$ (T9) and the $11^{th}$ TFT (T11) and used in an alternating manner.

While the output terminal outputs the output signal (Gout (n)) of the n-th stage at the high level voltage (during the scan period), the $12^{th}$ TFT (T12) discharges the QB node at the low level voltage and turns off the $8^{th}$ TFT (T8) that discharges the output terminal.

In other words, the $9^{th}$ (T9) and the $11^{th}$ TFT (T11) make the QB node swing in an alternating manner during the non-scan period, and the $12^{th}$ TFT (T12) discharges the QB node in accordance with the scan period.

To implement the aforementioned operation, the drain and the gate of the $9^{th}$ TFT (T9) are connected to the $1^{st}$ clock (CLK(n)), and the source is connected to the QB node. The drain of the $11^{th}$ TFT (T11) is connected to the QB node, the gate is connected to the $2^{nd}$ clock (CLK(n+4)) lagging the 1st clock (CLK(n)) by 4 horizontal periods (4H), and the source is connected to the low level power line (VSS). The drain of the $12^{th}$ TFT (T12) is connected to the QB node, the gate is connected to the output terminal, and the source is connected to the low level power line (VSS).

Figure 7:
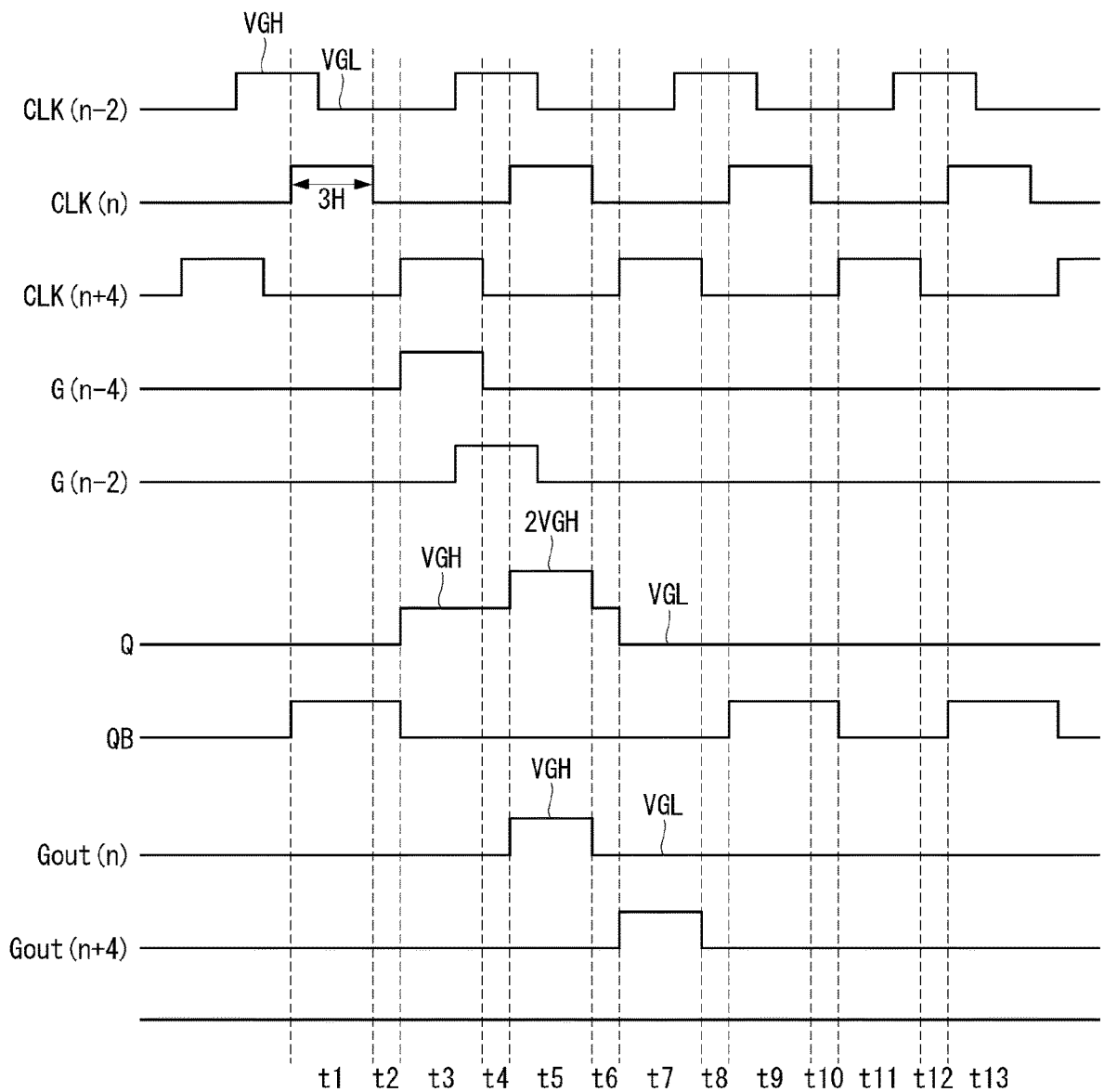
FIG. 7 illustrates input and output waveforms of the GIP circuit of FIG. 6.

FIG. 7 illustrates input and output waveforms of the GIP circuit of FIG. 6, and Table 1 shows on/off timing and voltage levels of a Q node, QB node, and output signal for each TFT.

TABLE 1

| TFT | t1 | t2 | t3 | t4 | t5 | t6 | t7 | t8 | t9 | t10 | t11 | t12 | t13 |
| --- | --- | --- | --- | --- | --- | --- | --- | --- | --- | --- | --- | --- | --- |
| T1 | OFF | OFF | ON | OFF | OFF | OFF | OFF | OFF | OFF | OFF | OFF | OFF | OFF |
| T2 | OFF | OFF | OFF | OFF | OFF | OFF | ON | OFF | OFF | OFF | OFF | OFF | OFF |
| T3 | NF | OFF | FN | ON | NF | OFF | FN | ON | NF | OFF | FN | ON | NF |
| T5 | OFF | OFF | OFF | OFF | ON | OFF | OFF | OFF | OFF | OFF | OFF | OFF | OFF |
| T6 | OFF | OFF | OFF | OFF | ON | OFF | OFF | OFF | OFF | OFF | OFF | OFF | OFF |
| T7 | OFF | OFF | ON | OFF | OFF | OFF | ON | OFF | OFF | OFF | ON | OFF | OFF |
| T8 | ON | ON | OFF | OFF | OFF | OFF | OFF | OFF | ON | ON | OFF | OFF | ON |
| T9 | ON | OFF | OFF | OFF | ON | OFF | OFF | OFF | ON | OFF | OFF | OFF | ON |
| T11 | OFF | OFF | ON | OFF | OFF | OFF | ON | OFF | OFF | OFF | ON | OFF | OFF |
| T12 | OFF | OFF | OFF | OFF | ON | OFF | OFF | OFF | OFF | OFF | OFF | OFF | OFF |
| Q | L | L | H | H | H(x2) | H | L | L | L | L | L | L | L |

TABLE 1-continued

| TFT | t1 | t2 | t3 | t4 | t5 | t6 | t7 | t8 | t9 | t10 | t11 | t12 | t13 |
|---|---|---|---|---|---|---|---|---|---|---|---|---|---|
| QB | H | H | L | L | L | L | L | L | H | H | L | L | H |
| Gn | L | L | L | L | H | L | L | L | L | L | L | L | L |

Now the operation of the GIP circuit will be described on the basis of period.

First, at the beginning portion of the first period (t1), since the $3^{rd}$ clock (CLK(n−2)) is at the high level (high potential voltage) and the output of the (n−2)-th stage is at the low level (low potential voltage), the $3^{rd}$ TFT (T3) is turned on, and the Q node is set to the low level voltage (is maintained at the previous low level voltage). In the latter portion of t1, the $3^{rd}$ clock (CLK(n−2)) is changed to the low level, so the $3^{rd}$ TFT (T3) becomes turned off but the Q node maintains at the low level voltage. Since the Q node is maintained at the low level voltage, the output terminal maintains at the low level voltage.

Since the output terminal is at the low level voltage during this period, the $12^{th}$ TFT (T12) may enter the turn-off state or may be kept in the turn-off state from before. Accordingly, the QB node is influenced by the $9^{th}$ (T9) and the $11^{th}$ TFT (T11) without being influenced by the $12^{th}$ TFT (T12). The 1st clock is at the high level, so the $9^{th}$ TFT (T9) is turned on, and the $2^{nd}$ clock (CLK(n+4)) is at the low level, so the $11^{th}$ TFT (T11) is turned off, thus the QB node is set to the high level. Since the QB node is at the high level, the $8^{th}$ TFT (T8) is turned on, discharges the output terminal, and maintains the output terminal at the low level voltage.

Therefore, during the first period (t1), the Q node and the output terminal maintain the low level, and the QB node transitions from the low level to the high level.

During the second period (t2), the $1^{st}$ clock (CLK(n)) transitions from the high level to the low level, and the $9^{th}$ TFT (T9) is turned off. However, the $11^{th}$ TFT (T11) is maintained in the turn-off state. Therefore, while the QB node is maintained at the previous high level without being influenced by the $9^{th}$ (T9), $11^{th}$ (T11) and $12^{th}$ TFT (T12), the $8^{th}$ TFT (T8) is maintained in the turn-on state, and the output terminal is maintained at the low level voltage.

Therefore, during the $2^{nd}$ period (t2), the Q node and the output terminal maintain at the low level, and the QB node maintains the high level.

During the $3^{rd}$ period (t3), the output (Gout(n−4)) of the (n−4)-th stage is set to the high level (high potential voltage), the $1^{st}$ TFT (T1) is turned on, and the Q node transitions from the low level to the high level voltage. Also, the $2^{nd}$ clock (CLK(n+4)) also transitions from the low level to the high level, the $11^{th}$ TFT (T11) is turned on. Accordingly, the QB node transitions from the high level to the low level, and the $8^{th}$ TFT (T8) is turned off. Also, the $7^{th}$ TFT (T7) is turned on by the $2^{nd}$ clock (CLK(n+4)), and the output terminal remains at the low level voltage.

In the middle of the $3^{rd}$ period (t3), the $3^{rd}$ clock (CLK (n−2)) transitions from the low level to the high level, the output (Gout(n−2)) of the (n−2)-th stage transitions from the low level voltage to the high level voltage, and the $1^{st}$ TFT (T1) changes its state from the turn-off state to the turn-on state. However, since the Q node has already been changed to the high level voltage at the beginning portion of the $3^{rd}$ period (t3), the voltage at the Q node is not influenced and remains at the high level voltage.

Therefore, during the $3^{rd}$ period (t3), the Q node transitions from the low level to the high level, the output terminal maintains the low level, and the QB node transitions from the high level to the low level.

During the $4^{th}$ period (t4), the $2^{nd}$ clock (CLK(n+4)) transitions from the high level to the low level, and the $7^{th}$ (T7) and the $11^{th}$ TFT (T11) changes their state from the turn-on state to the turn-off state. However, the output terminal is not influenced but remains at the low level voltage. The Q node and the QB node maintain the high level (high potential voltage) and the low level, respectively.

During the $5^{th}$ period (t5), the $1^{st}$ clock (CLK(n)) transitions from the low level to the high level; the high level voltage of the $1^{st}$ clock (CLK(n)) is supplied to the Q node which is connected to the gate line of the $5^{th}$ TFT (T5), the Q node voltage rises from the high level voltage (VGH) to 2VGH, the $5^{th}$ TFT (T5) is turned on, and the output terminal transitions from the low level voltage to the high level voltage. The $6^{th}$ TFT (T6) is turned on according to the high level voltage of the output terminal, and the output terminal remains at the high level voltage. During the $5^{th}$ period (t5), the $3^{rd}$ TFT (T3) is turned off by the $3^{rd}$ clock (CLK(n−2)) that transitions from the high level to the low level, which does not influence the Q node.

During this period, the $9^{th}$ TFT (T9) is set to the high level by the 1st clock (CLK(n)); however, according to the high level voltage of the output terminal, the $12^{th}$ TFT (T12) is turned on, the QB node remains at the low level (low potential voltage), and the $8^{th}$ TFT (T8) maintains the turn-off state by the low level voltage of the QB node.

Therefore, during the $5^{th}$ period (t5), the Q node transitions from the high level voltage (VGH) to 2VGH, the output terminal transitions from the low level voltage to the high level voltage to output gate pulses, and the QB node maintains the low level.

During the $6^{th}$ period (t6), the $1^{st}$ clock (CLK(n)) transitions from the high level to the low level. Since the $5^{th}$ TFT (T5) remains in the turn-on state during a short time interval in which the Q node falls from 2VGH down to the high level voltage (VGH), the output terminal at the high level voltage transitions to the low level (low potential voltage) of the $1^{st}$ clock (CLK(n)). The output terminal is set to the low level voltage, so the $7^{th}$ TFT (T7) is also turned off. The $9^{th}$ TFT (T9) is also turned off by the $1^{st}$ clock (CLK(n)) and exerts no influence on the QB node.

During this period, the output terminal is set to the low level voltage, the $12^{th}$ TFT (T12) is turned on, the QB node transitions accordingly to the low level, and the $8^{th}$ TFT (T8) is turned off, exerting no influence on the output terminal.

Therefore, during the $6^{th}$ period (t6), the Q node transitions from 2VGH to the high level voltage (VGH), the output terminal transitions from the high level voltage to the low level voltage, and the QB node maintains the low level.

During the $7^{th}$ period (t7), the $2^{nd}$ TFT (T2) is turned on by the output signal (Gout(n+4)) of the (n+4)-th stage and discharges the Q node at the high level voltage (VGH) to the low level voltage. The $3^{rd}$ clock (CLK(n−2)) transitions from the low level to the high level and turns on the $3^{rd}$ TFT (T3) in the middle of the $7^{th}$ period (t7); however, since the output (Gout(n−2)) of the (n−2)-th stage is at the low level (low potential voltage), the Q node remains at the low level voltage.

Also, during the 7$^{th}$ period (t7), the 1$^{st}$ clock (CLK(n)) remains at the low level, and the 2$^{nd}$ clock (CLK(n+4)) transitions from the low level to the high level; the 2$^{nd}$ clock (CLK(n+4)) at the low level turns on the 7$^{th}$ (T7) and the 11$^{th}$ TFT (T11). The output terminal is additionally discharged by the 7$^{th}$ TFT (T7) but remains at the low level voltage. Although the 11$^{th}$ TFT (T11) discharges the QB node to the low level voltage, since the QB node is at the low level voltage during the t6 period, the output terminal is still kept at the low level voltage.

Therefore, during the 7$^{th}$ period (t7), the Q node, output terminal, and QB node all remain at the low level voltage.

During the 8$^{th}$ period (t8), the output (Gout(n+4)) of the (n+4)-th stage and the 2$^{nd}$ clock (CLK(n+4)) transition from the high level to the low level, and the 2$^{nd}$ (T2) and the 11$^{th}$ TFT (T11) are turned off accordingly; however, the Q node, output terminal, and the QB node are not influenced and remain at the voltage level during the 7$^{th}$ period (t7).

Therefore, during the 8$^{th}$ period (t8), the Q node, output terminal, and QB node all remain at the low level voltage during the 7$^{th}$ period (t7).

During the 9$^{th}$ period (t9), the 1$^{st}$ clock (CLK(n)) transitions from the low level to the high level, and the 2$^{nd}$ clock (CLK(n+4)) maintains the low level. The 9$^{th}$ TFT (T9) is turned on by the 1$^{st}$ clock (CLK(n)) at the high level, the QB node transitions from the low level to the high level, the 8$^{th}$ TFT (T8) is turned on by the QB node at the high level, and the output terminal is discharged to the low level voltage. However, since the output terminal is already at the low level voltage, the output terminal remains at the low level voltage.

In the middle of the 9$^{th}$ period (t9), the 3$^{rd}$ clock (CLK(n−2)) transitions from the high level to the low level, and the 3$^{rd}$ TFT (T3) is turned off; however, the aforementioned operation exerts no influence on the Q node, and the Q node remains at the low level voltage.

Therefore, during the 9$^{th}$ period (t9), the Q node and the output terminal maintain the low level voltage, and the QB node transitions from the low level voltage to the high level voltage.

During the 10$^{th}$ period (t10), the 1$^{st}$ clock (CLK(n)) transitions from the high level to the low level, and the 2$^{nd}$ clock (CLK(n+4)) maintains the low level. The 9$^{th}$ TFT (T9) is turned off by the 1$^{st}$ clock (CLK(n)) at the low level, which exerts no influence on the QB node, the QB node maintains the high level, and the 8$^{th}$ TFT (T8) is also kept in the turn-on state, discharging the output terminal to the low level voltage.

Therefore, during the 9$^{th}$ period (t9), the Q node and the output terminal maintain the low level voltage, and the QB node remains at the high level voltage.

During the 11$^{th}$ period (t11), the 1$^{st}$ clock (CLK(n)) maintains the low level, and the 2$^{nd}$ clock (CLK(n+4)) transitions from the low level to the high level. The 7$^{th}$ TFT (T7) is turned on by the 2$^{nd}$ clock (CLK(n+4)) at the high level and discharges the output terminal. The 11$^{th}$ TFT (T11) is turned on by the 2$^{nd}$ clock (CLK(n+4)) at the high level, the QB node transitions from the high level voltage to the low level voltage, and the 8$^{th}$ TFT (T8) is turned off accordingly.

In the middle of the 11$^{th}$ period (t11), the 3$^{rd}$ clock (CLK(n−2)) transitions from the low level to the high level, and the 3$^{rd}$ TFT (T3) is turned on; however, since the output (Gout(n−2)) of the (n−2)-th stage is at the low level (low potential voltage), the Q node remains at the low level voltage.

Therefore, during the 11$^{th}$ period (t11), the Q node and the output terminal maintains the low level voltage, and the QB node transitions from the high level voltage to the low level voltage.

During the 12$^{th}$ period (t12), the 1$^{st}$ clock (CLK(n)) maintains the low level, and the 2$^{nd}$ clock (CLK(n+4)) transitions from the high level to the low level. The 7$^{th}$ TFT (T7) is turned off by the 2$^{nd}$ clock (CLK(n+4)) at the low level and exerts no influence on the output terminal. The 11$^{th}$ TFT (T11) is turned off by the 2$^{nd}$ clock (CLK(n+4)) at the low level, and the QB node is not influenced and maintains the low level.

Therefore, during the 12$^{th}$ period (t12), the Q node, output terminal, and QB node maintains the low level voltage.

The same operation for the 9$^{th}$ period (t9) is performed during the 13$^{th}$ period (t13). During the non-scan period excluding the period in which the Q node is charged (scan period), the operations performed for the 7$^{th}$ to the 10$^{th}$ period are repeated. Accordingly, the QB node for controlling the 8$^{th}$ TFT (T8), which discharges the output terminal, is not fixed to a DC value but swings between the high level and the low level voltages in the alternating manner.

The output terminal is charged to the high level voltage by the 5$^{th}$ (T5) and the 6$^{th}$ TFT (T6) during the 5$^{th}$ period (t5) and is kept to the low level voltage for the remaining time interval except for the 5$^{th}$ period (t5). The output terminal is discharged to the low level voltage by the 8$^{th}$ TFT (T8) for the periods of t1, t2, t9, t10, and t13 where the QB node is at the high level. The output terminal is discharged to the low level voltage by the 7$^t$ TFT (T7) for the periods of t3, t7, and t11 where the 2$^{nd}$ clock (CLK(n+4)) is at the high level. In this way, the output terminal is discharged in an alternating manner by the 7$^{th}$ (T7) and the 8$^{th}$ TFT (T8).

Meanwhile, for the periods of t4, t6, t8, and t12 where the 7$^{th}$ (T7) and the 8$^{th}$ TFT (T8) do not operate, the 1$^{st}$ clock (CLK(n)) is at the low level (low potential voltage); therefore, ripples are generated for the corresponding period. If the 6$^{th}$ TFT (T6) is turned on by the ripples, the output terminal is discharged to the low level (low potential voltage) by the 1$^{st}$ clock (CLK(n)).

However, although the output terminal is floated for the periods of t4, t6, t8, and t12, each individual period does not last long, being separated from each other and disposed between discharging intervals. Therefore, even if the 6$^{th}$ TFT (T6) is omitted, ripples may be prevented from being generated at the output terminal.

Figure 8:
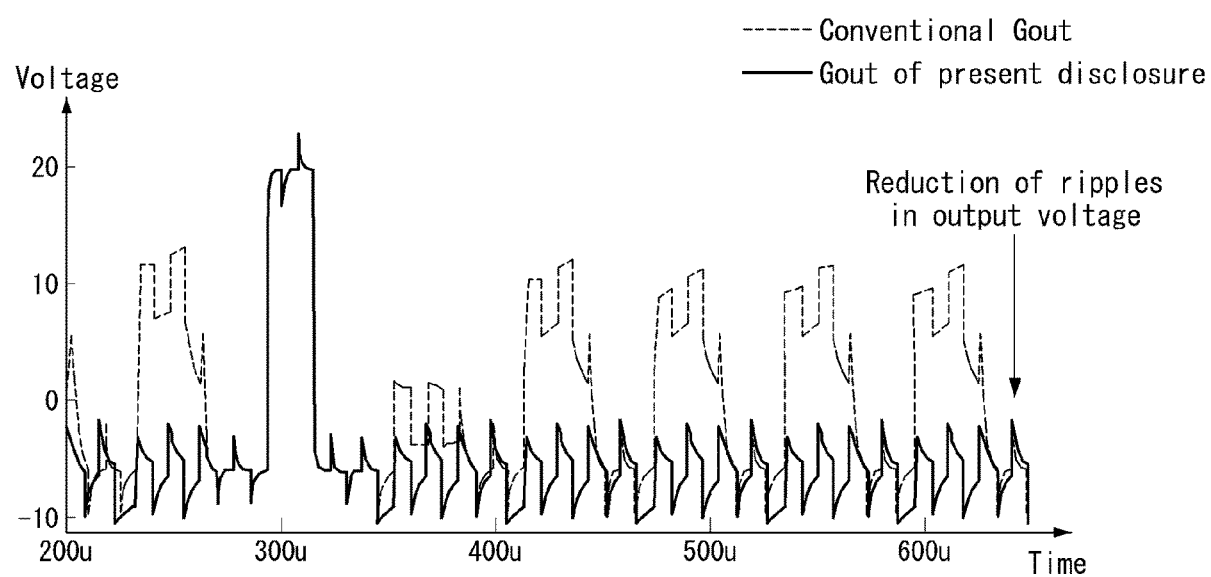
FIG. 8 illustrates an output signal according to the present disclosure, the output signal being compared with an output signal from the GIP circuit of FIG. 1.

FIG. 8 illustrates an output signal according to the present disclosure being compared with the output signal from the GIP circuit of FIG. 1. When the 1$^{st}$ clock (CLK(n)) is at the high level and the output signal (Gout(n)) of a current stage is at the low level (low potential voltage) by the GIP circuit of FIG. 6, ripples generated by the coupling between the data lines and the gate lines may be reduced by pulling down the output terminal through the 8$^{th}$ TFT (T8) as shown in FIG. 8.

Figure 9:
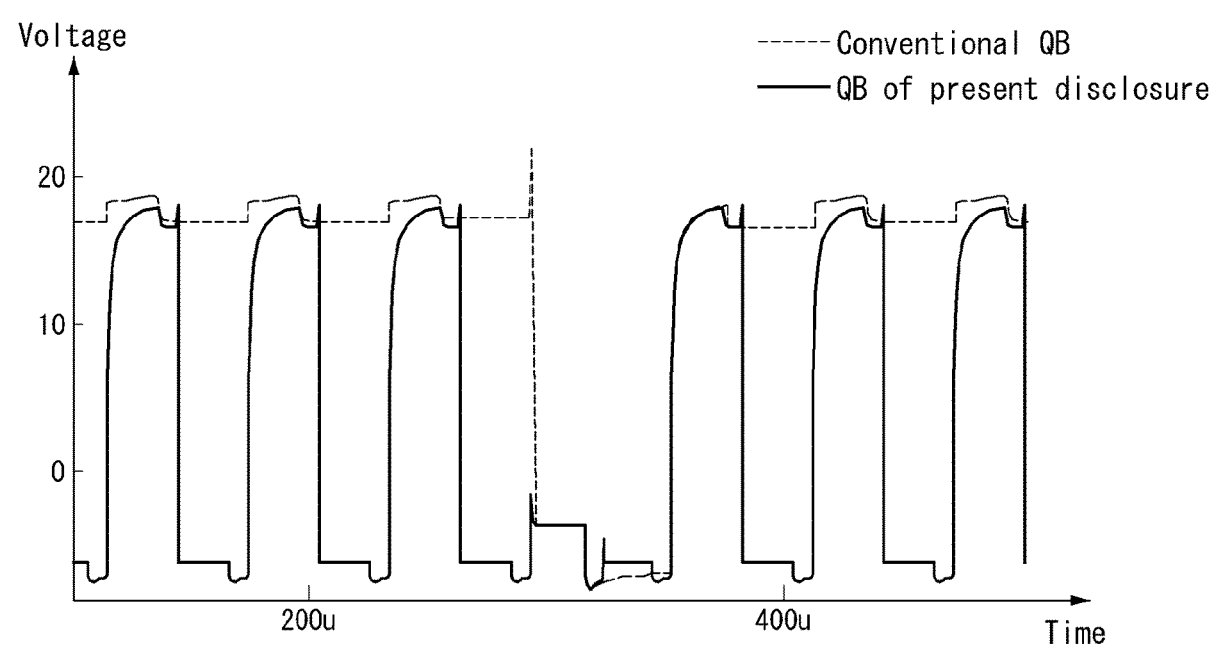
FIG. 9 illustrates the voltage of a QB node swinging in an alternating manner while an output terminal outputs a low level voltage according to the present disclosure.

FIG. 9 illustrates the voltage of a QB node swinging in the alternating manner while an output terminal outputs a low level voltage according to the present disclosure. By adding the 12$^{th}$ TFT (T12) which pulls down the QB node, the QB node swings in the alternating manner as shown in FIG. 9, preventing the 8$^{th}$ TFT (T8) the gate of which is connected to the QB node from receiving DC stress and securing a margin required for reliability evaluation.

Also, compared with the GIP circuit of FIG. 3, the GIP circuit of FIG. 6 may remove contact holes of TFTs and reduce the sizes of the TFTs, thereby slimming down the bezel. Therefore, even if a margin is not sufficiently secured during the non-scan period in which no gate pulses are generated, buffer size may still be increased.

Figure 10:
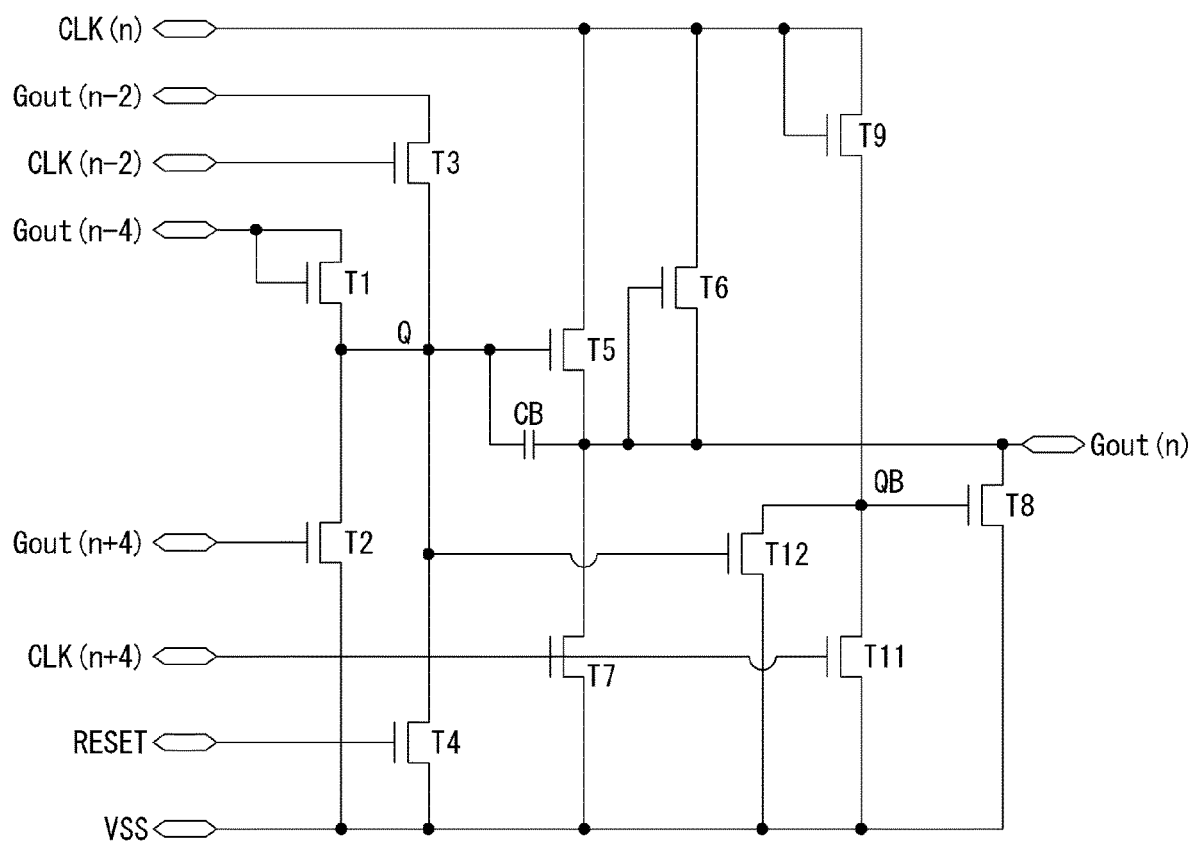
FIG. 10 illustrates a GIP circuit according to another aspect of the present disclosure.

FIG. 10 illustrates a GIP circuit according to another aspect of the present disclosure.

The GIP circuit of FIG. 10 is similar to the GIP circuit of FIG. 6 except that the gate of the $12^{th}$ TFT (T12) is connected to the Q node rather than the output terminal. Referring to the GIP circuit of FIG. 10, the $12^{th}$ TFT (T12) is turned on for the periods of t3, t4, and t6 (those periods where the Q node is at the high level, and the output terminal is at the low level), which is different from the operations shown in Table 1, but the voltage at the QB node maintains the low level, yielding the same waveforms as shown in FIG. 7.

By connecting the gate of the $12^{th}$ TFT (T12) to the Q node at the high voltage, the QB node is pulled down by a higher voltage, thereby reducing the size of the $12^{th}$ TFT (T12).

Figure 11:
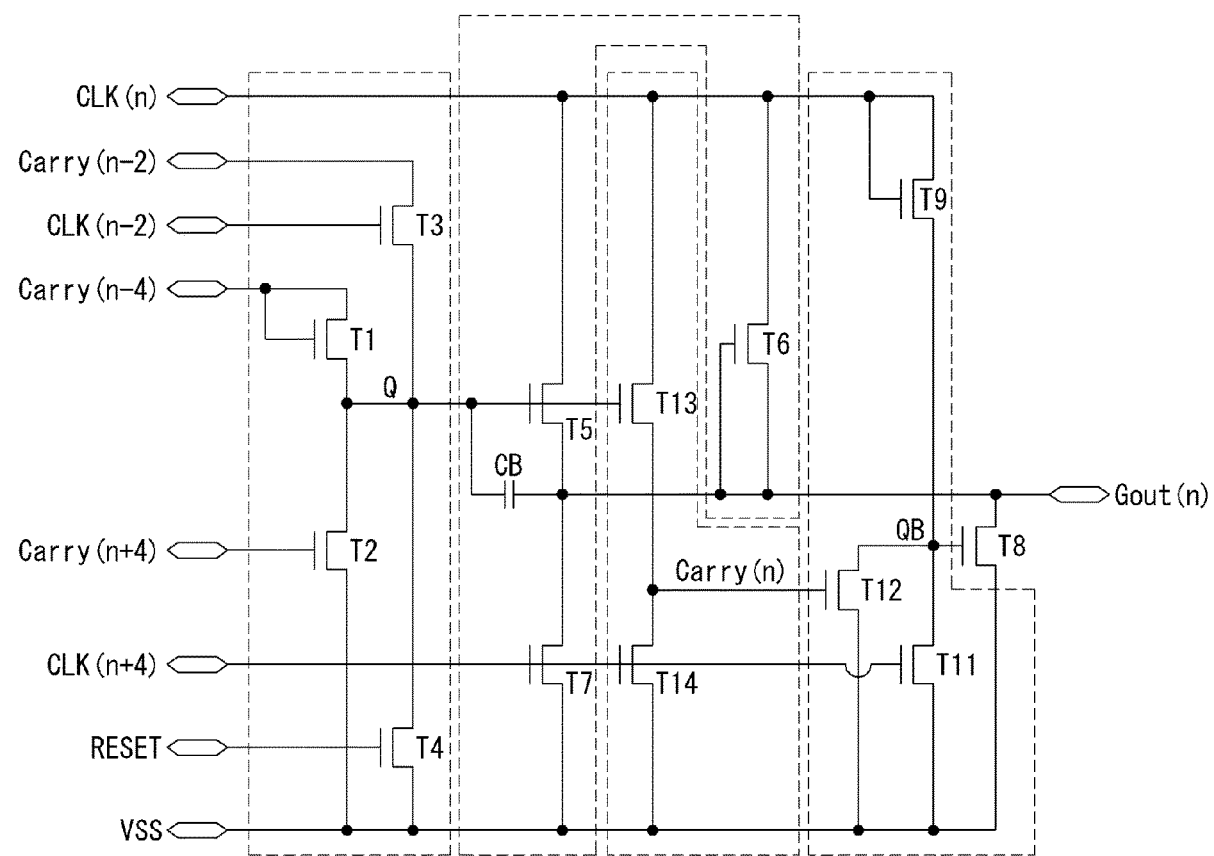
FIG. 11 illustrates a GIP circuit according to a yet another aspect of the present disclosure.

FIG. 11 illustrates a GIP circuit according to a yet another aspect of the present disclosure.

The GIP circuit of FIG. 11 further includes a carry unit in addition to the GIP circuit of FIG. 6, which comprises a $13^{th}$ (T13) and a $14^{th}$ TFT (T14) and outputs a carry signal (Carry(n)) synchronized with the output signal (Gout(n)). The GIP circuit of FIG. 11 uses a carry signal instead of the output signal from a previous stage or a subsequent stage, and the gate of the $12^{th}$ TFT (T12) for discharging the QB node uses the carry signal from the carry unit instead of using the output signal.

The drain of the $13^{th}$ TFT (T13) is connected to the $1^{st}$ clock (CLK(n)), the gate is connected to the Q node, and the source is connected to the gate of the $12^{th}$ TFT (T12), thereby outputting a carry signal (Carry(n)). In the case of the $14^{th}$ TFT (T14), the drain is connected to the source of the $13^{th}$ TFT (T13), the gate is connected to the $2^{nd}$ clock (CLK(n+4)), and the source is connected to the low level power line (VSS).

The $13^{th}$ (T13) and the $14^{th}$ TFT (T14) of the carry unit operate nearly at the same timing with the $5^{th}$ (T5) and the $7^{th}$ TFT (T7) of the output unit and output the carry signal (Carry(n)) synchronized with the output signal (Gout(n)) of the output terminal. The carry signal is transmitted to the gate of the $12^{th}$ TFT (T12) and is output to other stage as a control signal.

The carry signal (Carry(n)) has a smaller load than the output signal (Gout(n)) and provides a shorter signal rise time, thereby quickly stabilizing the QB node through the 12th TFT (T12). Also, the Q node may be pulled down more quickly by providing the carry signal to the gate or drain of the $2^{nd}$ (T2) and the $3^{rd}$ TFT (T3) instead of the output signal from a previous or subsequent stage.

Since the GIP circuits of FIGS. 10 and 11 are similar to the GIP circuit of FIG. 6, repeated descriptions of specific operations and signals will be omitted, but an advantageous effect compared with the conventional GIP circuit is the same as the effect obtained from the GIP circuit of FIG. 6.

Figure 12:
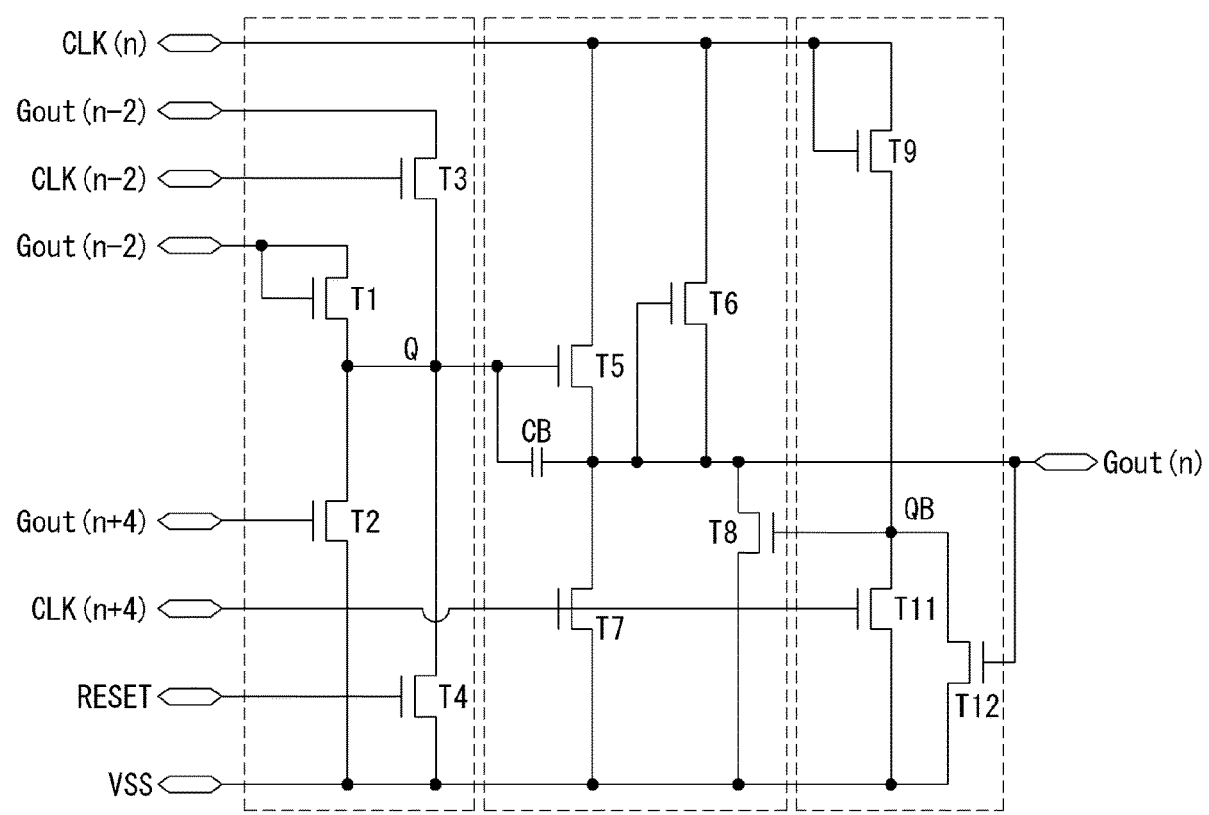
FIG. 12 illustrates a GIP circuit according to a still another aspect of the present disclosure.
Figure 13:
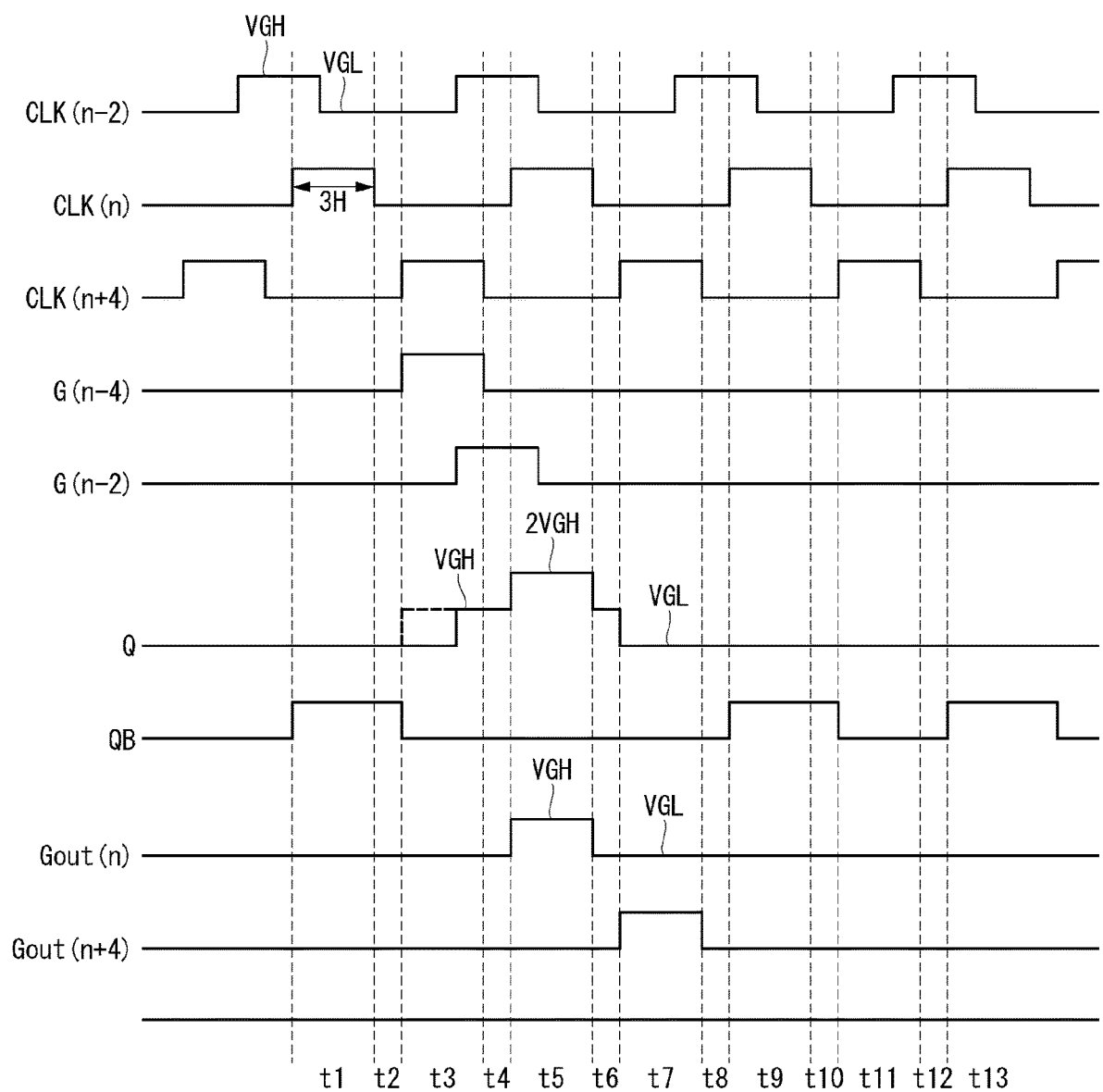
FIG. 13 illustrates input and output waveforms of the GIP circuit of FIG. 12.

FIG. 12 illustrates a GIP circuit according to a still another aspect of the present disclosure, and FIG. 13 illustrates input and output waveforms of the GIP circuit of FIG. 12.

In the GIP circuit of FIG. 6, the $1^{st}$ TFT (T1) is intended for pre-charging the Q node before generating the output signal (Gout(n)) of the n-th stage in the form of a pulse synchronized for a part of high level voltage periods of the $1^{st}$ clock (CLK(n)) and uses the output signal of the (n−4)-th stage (Gout(n−4)) leading the output signal (Gout(n)) by 4 horizontal periods (4H). Even if the pre-charging period is reduced to 2 horizontal period (2H), since the output terminal is discharged by the $7^{th}$ TFT (T7) turned on by the $2^{nd}$ clock (CLK(n+4)) during the period of t3 of FIG. 7, no problem is caused for the operation of outputting gate pulses.

Therefore, in the GIP circuit of FIG. 12, the drain and the gate of the $1^{st}$ TFT (T1) may be connected to the output signal of the (n−2)-th stage (Gout(n−2)) instead of the output signal (Gout(n−4)) of the (n−4)-th stage. The input and output waveforms of FIG. 13 are the same as those (dotted lines) of FIG. 7 except that the Q node is pre-charged 2 horizontal periods later.

Accordingly, the number of output signals of previous stages required for generating an output signal of the n-th stage can be reduced, and moreover, the output signal from a distant stage away from a current stage is not used, resulting in more simplified connections between stages.

Figure 14:
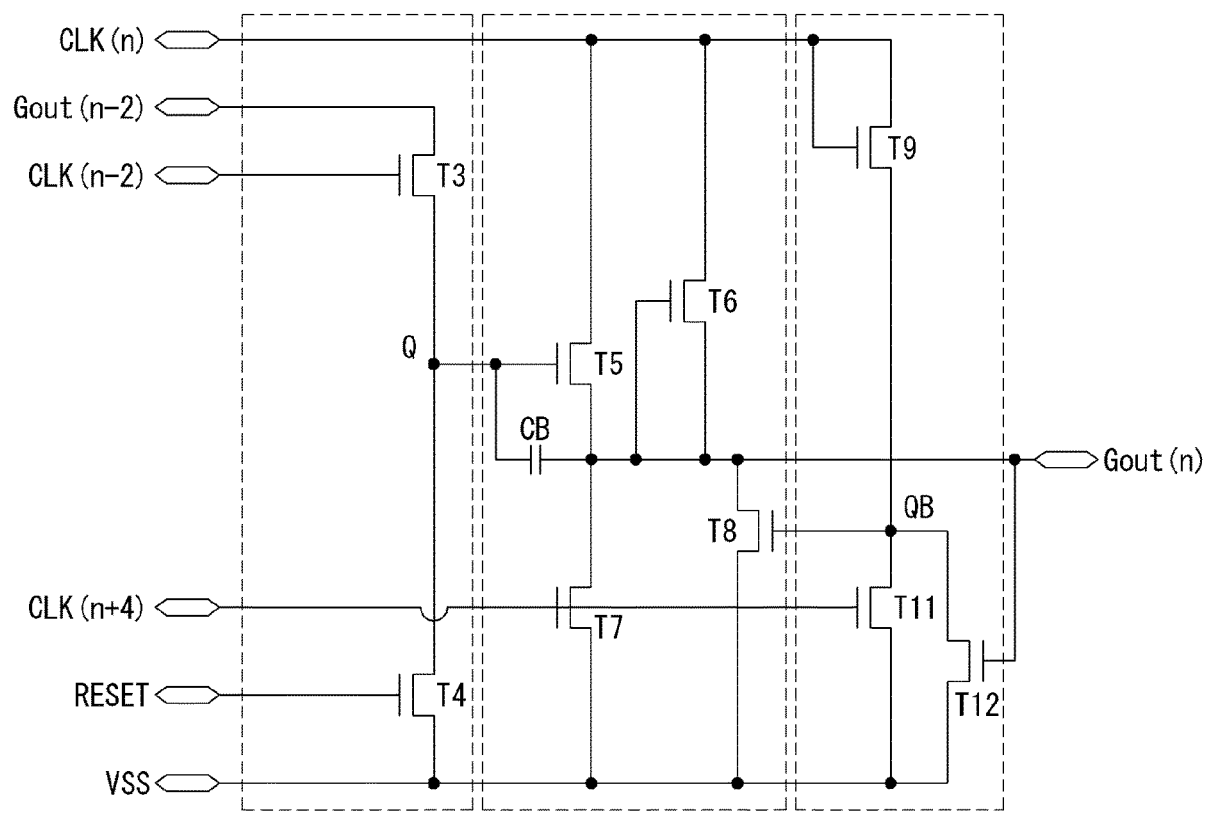
FIG. 14 illustrates a GIP circuit according to a further aspect of the present disclosure.
Figure 15:
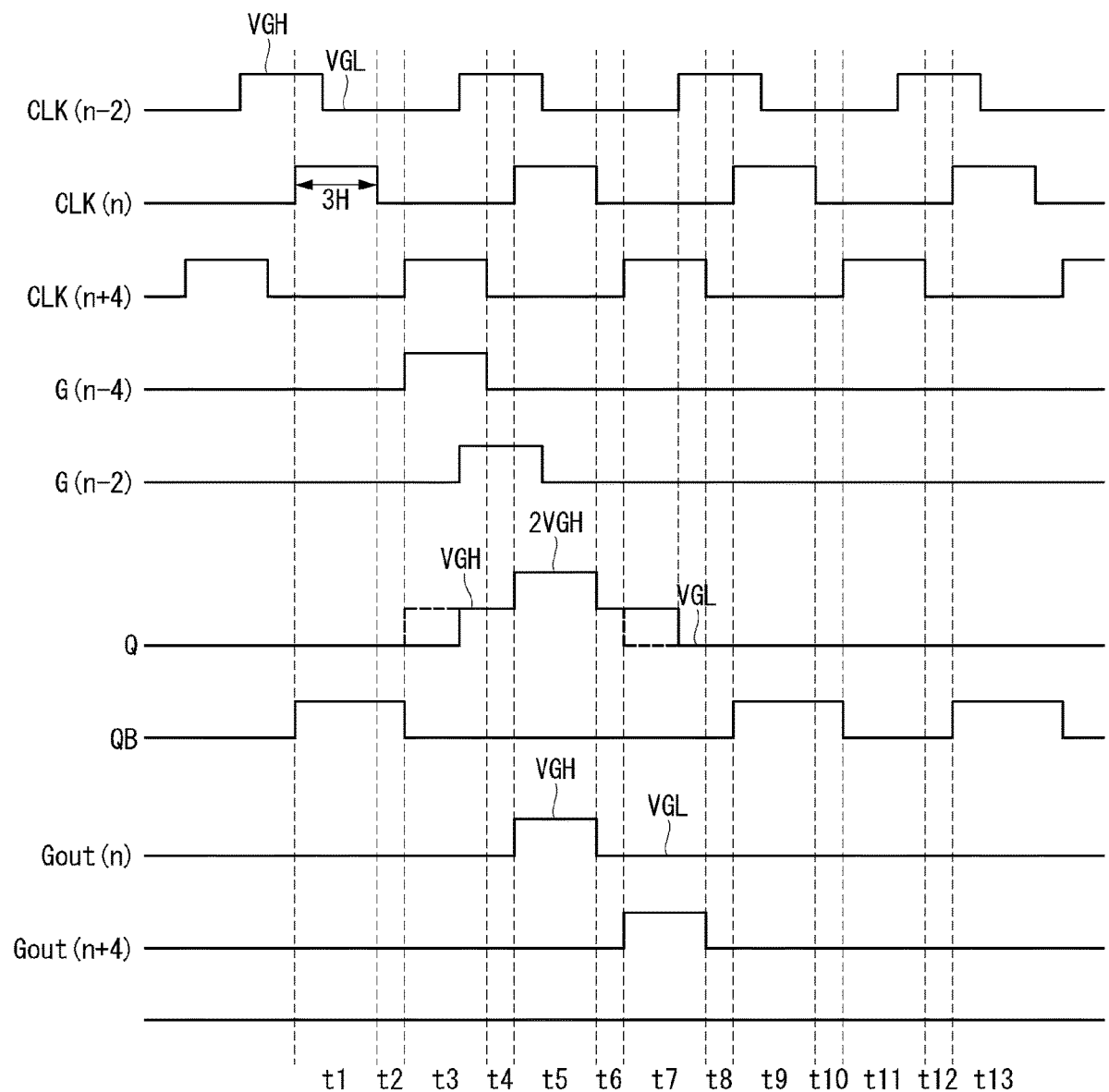
FIG. 15 illustrates input and output waveforms of the GIP circuit of FIG. 14.

FIG. 14 illustrates a GIP circuit according to a further aspect of the present disclosure, and FIG. 15 illustrates input and output waveforms of the GIP circuit of FIG. 14.

In the GIP circuit of FIG. 6, the $1^{st}$ (T1), the $2^{nd}$ TFT (T2) and the control signals (Gout(n−4), Gout(n+4)) that control the TFTs are intended to determine the pre-charging start time and the discharging time of the Q node. As may be seen from the GIP circuit of FIG. 12, no problem arises even if the Gout(n−2) is used instead of the Gout(n−4) and the pre-charging is delayed by 2 horizontal periods. Therefore, of the $1^{st}$ TFT (T1) and the $3^{rd}$ TFT (T3) the operations of which overlap each other during the corresponding time interval, the $1^{st}$ TFT (T1) may be removed.

Moreover, FIG. 7 shows that the $2^{nd}$ TFT (T2) is turned on by the Gout(n+4) for the period of t7, and the Q node is discharged. Since the output terminal and the QB node are discharged by the $7^{th}$ (T7) and the $11^{th}$ TFT (T11) turned on by the $2^{nd}$ clock (CLK(n+4)) for the period of t7, no problem arises even if the time for discharging the Q node is delayed. In other words, without involving the $2^{nd}$ TFT (T2), the Q node may be discharged by only the $3^{rd}$ TFT (T3) turned on by the $3^{rd}$ clock (CLK(n−2)) which transitions from the low level to the high level for the period of t7.

The input and output waveforms of FIG. 15 are the same as the waveforms (dotted lines) of FIG. 7 except that the Q node is pre-charged 2 horizontal periods later and discharged 2 horizontal periods later.

Therefore, an output signal may be obtained in a normal manner even if only the $3^{rd}$ TFT (T3), which is controlled by the $3^{rd}$ clock (CLK(n−2)) and the output signal (Gout(n−2)) or carry signal (Carry(n−2)) of the (n−2)-th stage, is used for controlling charging and discharging of the Q node.

The GIP circuits of FIGS. 12 and 14 may be combined with the GIP circuits of FIGS. 10 and 11.

According to the present disclosure, while ripples due to interlaced operation are reduced, a GIP configuration yielding slim bezels may also be obtained by using a smaller number of TFTs. Also, TFTs for discharging output terminals are prevented from being subjected to DC stress, which slows down degradation of the TFTs.

It should be understood by those skilled in the art from the descriptions given above that various modifications and variations may be made without departing from the technical spirit or scope of the present disclosure. Therefore, the technical scope of the present disclosure is not limited to the specifications provided in the detailed descriptions of this document but has to be defined by the appended claims.

What is claimed is:

1. A gate driving circuit, comprising:
a Q node controller controlling a voltage of Q node;
a QB node controller controlling a voltage of QB node;
an output unit generating a pulse-type output signal synchronized with a part of a $1^{st}$ clock (CLK(n)) by controlling charging and discharging of an output terminal according to the voltages of the Q node and the QB node,
wherein the voltage of the QB node is controlled in an alternating manner during a non-scan period in which the Q node controller outputs a low level voltage for the Q node, and
a carry generating unit outputting a $4^{th}$ carry signal (Carry (n)) synchronized with the pulse-type output signal based on the voltage of the Q node,
wherein the QB node controller discharges the QB node in response to the $4^{th}$ carry signal instead of the pulse-type output signal,
wherein the carry generation unit comprises a $13^{th}$ transistor having a drain connected to the $1^{st}$ clock, a gate connected to the Q node that is connected to a $1^{st}$ carry signal (Carry(n−4)) and a source outputting the $4^{th}$ carry signal lagging the $1^{st}$ carry signal by 4 horizontal periods and a $14^{th}$ transistor having a drain connected to the source of the $13^{th}$ transistor, a gate connected to a $2^{nd}$ clock (CLK(n+4)) lagging the $1^{st}$ clock by 4 horizontal periods, and a source connected to a low level power line, and generating the $4^{th}$ carry signal,
wherein the QB node controller comprises a $12^{th}$ transistor having a drain connected to the QB node, a gate connected to the source of the $13^{th}$ transistor, and a source connected to the low level power line,
wherein the $4^{th}$ carry signal is transmitted to the gate of the $12^{th}$ TFT,
wherein the $12^{th}$ transistor controls the voltage of the QB node to the low level voltage, in response to the $4^{th}$ carry signal instead of the pulse-type output signal, during a period in which the output unit drives an output terminal at a high level voltage or the Q node controller drives the Q node at a high level voltage,
wherein the QB node controller further comprises 9th and 11th transistors alternatively operated during the non-scan period,
wherein the 9th and the 11th transistors are respectively controlled by the 1st clock and the 2nd clock which do not overlap with each other in their high level voltage states, and cause the voltage of the QB node to swing between a high level voltage and a low level voltage during the non-scan period,
wherein the 9th transistor has a drain and a gate connected to the 1st clock, and a source connected to the QB node, and
wherein the 11th transistor has a drain connected to the QB node, a gate connected to the 2nd clock lagging the 1st clock by 4 horizontal periods, and a source connected to the low level power line.

2. The gate driving circuit of claim 1, wherein the output unit includes a $5^{th}$ transistor being turned on by bootstrapping of the Q node and charging the output terminal and an $8^{th}$ transistor discharging the output terminal according to a voltage of a capacitor connecting the Q node and the output terminal and the voltage of the QB node.

3. The gate driving circuit of claim 2, wherein the output unit comprises a $7^{th}$ transistor discharging the output terminal in an alternating manner with the $8^{th}$ transistor.

4. The gate driving circuit of claim 3, wherein the output unit comprises a $6^{th}$ transistor changing the output terminal to a low level voltage according to a high level voltage of the output terminal during the non-scan period.

5. The gate driving circuit of claim 4, wherein the $5^{th}$ transistor has a drain connected to the $1^{st}$ clock, a gate connected to the Q node, and a source connected to the output terminal;
the $6^{th}$ transistor has a drain connected to the $1^{st}$ clock, and a gate and a source connected to the output terminal;
the $7^{th}$ transistor has a drain connected to the output terminal, a gate connected to the $2^{nd}$ clock lagging the $1^{st}$ clock by 4 horizontal periods, and a source connected to the low level power line; and
the $8^{th}$ transistor has a drain connected to the output terminal, a gate connected to the QB node, and a source connected to the low level power line.

6. The gate driving circuit of claim 1, wherein the Q node controller comprises a $1^{st}$ transistor pre-charging the Q node to a high level voltage;
a $2^{nd}$ transistor changing the Q node from the high level voltage to a low level voltage; and
a $3^{rd}$ transistor maintaining the voltage of the Q node at the low level voltage during the non-scan period.

7. The gate driving circuit of claim 6, wherein the Q node controller comprises a $4^{th}$ transistor for changing the voltage of the Q node to the low level voltage according to a reset signal.

8. The gate driving circuit of claim 7, wherein the 1st transistor has a drain and a gate connected to the $1^{st}$ carry signal leading the pulse-type output signal by 4 horizontal periods or a $3^{rd}$ carry signal lagging the $1^{st}$ carry signal by 2 horizontal periods, and a source connected to the Q node;
the $2^{nd}$ transistor has a drain connected to the Q node, a gate connected to a $2^{nd}$ carry signal lagging the $1^{st}$ carry signal by 8 horizontal periods, and a source connected to the low level power line;
the $3^{rd}$ transistor has a drain connected to the $3^{rd}$ carry signal, a gate connected to a $3^{rd}$ clock leading the $1^{st}$ clock by 2 horizontal periods, and a source connected to the Q node; and
the $4^{th}$ transistor has a drain connected to the Q node, a gate connected to a reset terminal, and a source connected to the low level power line.

9. The gate driving circuit of claim 1, wherein the Q node controller includes a 3rd transistor pre-charging the Q node to a high level voltage and then changing the Q node from the high level voltage to a low level voltage, wherein the 3rd transistor has a drain connected to a 3rd carry signal leading the pulse-type output signal by 2 horizontal periods, a gate connected to a 3rd clock leading the 1st clock by 2 horizontal periods, and a source connected to the Q node.

10. A display device, comprising:
a display panel including data lines, gate lines, and pixels defined by the data lines and the gate lines;
a data driving circuit providing data signals to the data lines of the display panel;
a gate driving circuit providing gate pulses synchronized with the data signals to the gate lines of the display panel and including a plurality of stages connected in a cascade manner; and
a timing controller controlling timings of the data driving circuit and the gate driving circuit,
wherein each stage includes:
a Q node controller controlling a voltage of Q node;
a QB node controller controlling a voltage of QB node;

an output unit generating a pulse-type output signal synchronized with a part of a $1^{st}$ clock (CLK(n)) by controlling charging and discharging of an output terminal according to the voltages of the Q node and the QB node, wherein the voltage of the QB node is controlled in an alternating manner during a non-scan period in which the Q node controller outputs a low level voltage for the Q node; and a carry generating unit outputting a $4^{th}$ carry signal (Carry(n)) synchronized with the pulse-type output signal based on the voltage of the Q node, wherein the QB node controller discharges the QB node in response to the $4^{th}$ carry signal instead of the pulse-type output signal, wherein the carry generation unit comprises a $13^{th}$ transistor having a drain connected to the $1^{st}$ clock, a gate connected to the Q node that is connected to a carry signal (Carry(n−4)) and a source outputting the $4^{th}$ carry signal lagging the $1^{st}$ carry signal by 4 horizontal periods and a $14^{th}$ transistor having a drain connected to the source of the $13^{th}$ transistor, a gate connected to a $2^{nd}$ clock (CLK(n+4)) lagging the 1st clock by 4 horizontal periods, and a source connected to a low level power line, and generating the $4^{th}$ carry signal, wherein the QB node controller comprises a $12^{th}$ transistor having a drain connected to the QB node, a gate connected to the source of the $13^{th}$ transistor, and a source connected to the low level power line, wherein the $4^{th}$ carry signal is transmitted to the gate of the $12^{th}$ TFT, wherein the $12^{th}$ transistor controls the voltage of the QB node to the low level voltage, in response to the $4^{th}$ carry signal instead of the pulse-type output signal, during a period in which the output unit drives an output terminal at a high level voltage or the Q node controller drives the Q node at a high level voltage, wherein the QB node controller further comprises 9th and 11th transistors alternatively operated during the non-scan period, wherein the 9th and the 11th transistors are respectively controlled by the 1st clock and the 2nd clock which do not overlap each other in their high level voltage states, and cause the voltage of the QB node to swing between a high level voltage and a low level voltage during the non-scan period, wherein the 9th transistor has a drain and a gate connected to the 1st clock, and a source connected to the QB node, and wherein the 11th transistor has a drain connected to the QB node, a gate connected to the 2nd clock lagging the 1st clock by 4 horizontal periods, and a source connected to the low level power line.

11. The display device of claim 10, wherein the QB node controller comprises $9^{th}$ and $11^{th}$ transistors respectively controlled by the $1^{st}$ clock and the $2^{nd}$ clock which do not overlap each other in their high level voltage states, and cause the voltage of the QB node to swing between a high level voltage and a low level voltage during the non-scan period.

12. The gate driving circuit of claim 10, wherein the Q node controller comprises:
 a $1^{st}$ transistor pre-charging the Q node to a high level voltage;
 a $2^{nd}$ transistor changing the Q node from the high level voltage to a low level voltage; and
 a $3^{rd}$ transistor maintaining the voltage of the Q node at the low level voltage during the non-scan period.

\* \* \* \* \*